United States Patent
Ouyang

(10) Patent No.: US 6,536,019 B1
(45) Date of Patent: Mar. 18, 2003

(54) RACE CONDITION DETECTION AND EXPRESSION

(75) Inventor: Pei Ouyang, San Jose, CA (US)

(73) Assignee: Verisity Design, Inc., Mountain View, CA (US)

(*) Notice: Subject to any disclaimer, the term of this patent is extended or adjusted under 35 U.S.C. 154(b) by 196 days.

(21) Appl. No.: 09/672,382

(22) Filed: Sep. 28, 2000

(51) Int. Cl.⁷ .............................................. G06F 17/50
(52) U.S. Cl. .................................................. 716/4; 716/6
(58) Field of Search ........................................ 716/4, 6

(56) References Cited

PUBLICATIONS

Goering, R "Verisity claims Verilog lint checker is unique", EETimes, Dec. 1999, http://www.eetimes.com/story/OEG19991214S0007.*

"Tools and Technologies", EETimes, Feb. 1999, http://www.eedesign.com/editorial/1999/toolsandtech9902.html.*

* cited by examiner

*Primary Examiner*—Vuthe Siek
*Assistant Examiner*—Brandon Bowers
(74) *Attorney, Agent, or Firm*—Glenn Patent Group; Michael A. Glenn; Kirk D. Wong

(57) ABSTRACT

A method and apparatus for improved race detection and expression is disclosed. The race detection method and apparatus disclosed herein detects races statically by analyzing the circuits, which are usually written in a hardware description language (HDL), such as VHDL or Verilog. Compared with known simulation approaches, the inventive method and apparatus has at least the following advantages: no test vectors are required; all potential races can be detected; and in simulator approaches, if the right test vectors are not provided, then the races cannot be found (the invention avoids this last constraint).

27 Claims, 9 Drawing Sheets

RACE CONDITION DETECTION AND EXPRESSION

BACKGROUND OF THE INVENTION

1. Technical Field

The invention relates to circuit design. More particularly, the invention relates to race condition detection and expression.

2. Description of the Prior Art

A race condition is a very common and serious issue in circuit design. An example of a race condition is shown in Table 1 below by a Verilog program.

TABLE 1

Race Condition

```
module t(clk, a, b, c);
   input clk;
   output a;
   input b;
   input c;
   reg a;
   always @(posedge clk) a = b;
   always @(posedge clk) a = c;
endmodule
```

In this example, when the clock "clk" changes from "0" to "1", that is at the positive edge of clk, either a=b may happen first or a=c may happen first. That is, they may race each other. As a result, signal "a" may get the value of "b" or "c." In circuit design, this is an undesired effect because the final value of "a" is nondeterministic.

A race condition is defined as a situation where reading a variable may result in one of several values nondeterministically. To avoid races, circuits are usually designed in some specific ways to prevent a race condition.

Another approach is to detect during the design stage if the circuits may have races. Some circuit simulation tools, can detect a race condition when the simulator finds that, during the same simulation cycle, a signal (also referred to as a wire, register, or variable) is being written to two or more times, or being written to as well as being read from. See, for example, U.S. Pat. Nos. 5,383,167; 5,818,263; 5,901,061; and 6,009,256.)

An example of a simulator which can detect race conditions is the VCS Verilog Simulator from Synopsys. Such simulators need test vectors to conduct the simulation. The race may or may not be detected depending the way in which the test vectors exercise the design.

It would be advantageous to provide a method and apparatus for improved race detection and expression.

SUMMARY OF THE INVENTION

The invention provides a method and apparatus for improved race detection and expression. The race detection method and apparatus disclosed herein detects races statically by analyzing the circuits, which are usually written in a hardware description language (HDL), such as VHDL or Verilog.

Compared with known simulation approaches, the inventive method and apparatus has at least the following advantages:

No test vectors are required.

All potential races can be detected.

In the simulator approaches, if the right test vectors are not provided, then the races cannot be found. The invention avoids this constraint.

DETAILED DESCRIPTION OF THE INVENTION

The invention provides a method and apparatus for improved race detection and expression. The race detection method and apparatus disclosed herein detects races statically by analyzing the circuits, which are usually written in a hardware description language (HDL), such as VHDL or Verilog (see IEEE Std 1364–1995, *IEEE Standard Hardware Description Language Based on the Verilog Hardware Description Language*, IEEE, ISBN 1-55937-727-5 and IEEE Std 1076–1993, *IEEE Standard VHDL Language Reference Manual (ANSI)*, IEEE, ISBN: 1-55937-376-8.)

Race Graph

To detect the race statically, it is first necessary to provide a new style of representing (expressing) races. In contrast to conventional race representations, where a race is confined to a signal at a particular time point, the herein disclosed representation uses a race graph to represent the race.

Figure 1:
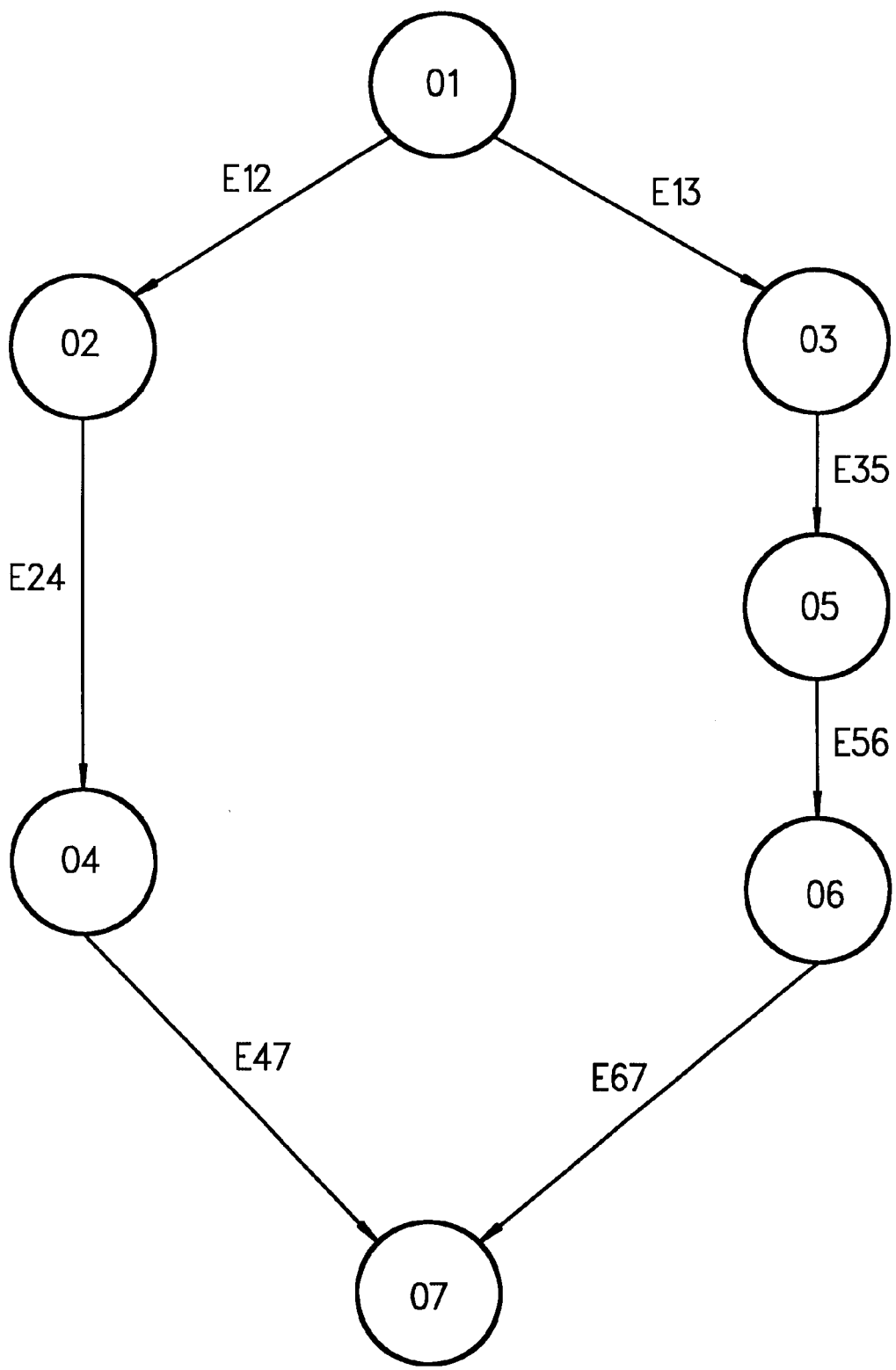
FIG. 1 is an example race graph according to the invention.

FIG. 1 is an example race graph according to the invention. In FIG. 1, O1 to O7 are objects. O1 is the source object, O7 is the target object, and O4 and O6 are anchor objects.

The race is started from O1. This is why it is called the source. While O1 is executed, O2 and O3 are triggered and executed via link E12 and E13, respectively. Executing O2 then triggers the execution of O4. At the same time, executing O3 triggers the execution of O5, and executing O5 triggers the execution of O6. Both O4 and O6 are competing for the common-target object O7. This is why O4 and O6 are called the anchors and O7 is called the target.

In a real life example, O7 could be a register in a circuit, and both O4 and O6 could be two computing elements which are trying to write to the common register O7 simultaneously.

To summarize, a race graph according to the presently preferred embodiment of the invention contains:

A source node, i.e. the object starting the race;

A target node, i.e. the object being raced for;

Two or more anchor nodes, i.e. the objects competing for the target object; and

Triggering edges, i.e. the edges, each of which links an object A to another object B, where executing A first results in B being executed next.

Linking a Race Graph with an HDL Design

The invention also comprises the notion of mapping the race graph to the circuit design, when used in a race detection software tool to help circuit designers to traverse the races easily. For example, suppose the design is written in Verilog. Mouse-clicking on a node or an edge of the race graph brings up a window showing the corresponding Verilog segments (see FIG. 2).

Figure 2:
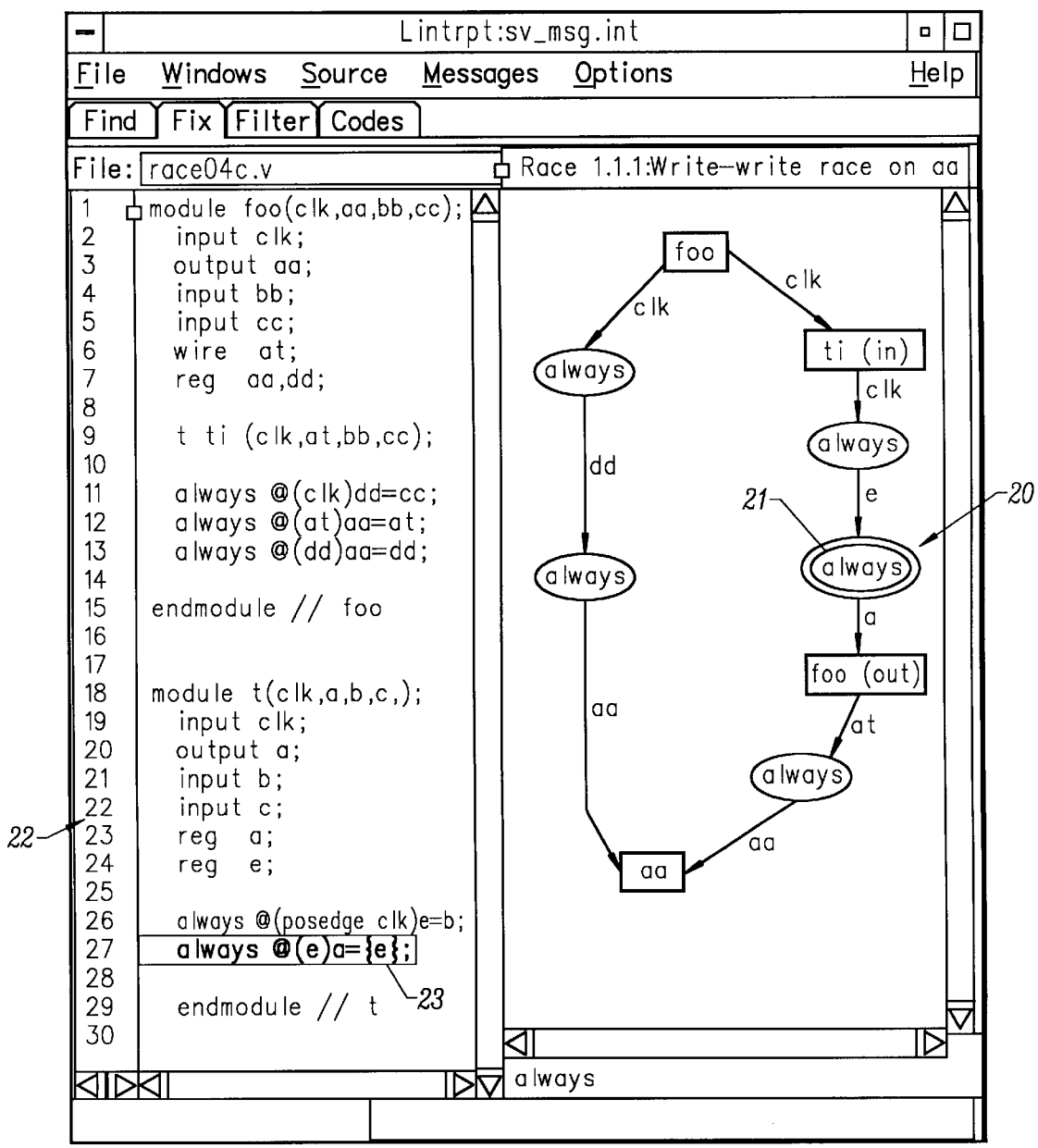
FIG. 2 is an illustration of a computer display in which a race graph is at the right and a Verilog design is at the left according to the invention.

In the graph of FIG. 2, the race graph 20 is shown at the right and the Verilog design 22 is shown at the left. At the race graph, a node 21 is highlighted by a mouse-clicking. In the corresponding Verilog design, the related source code for that node 23 is highlighted.

Figure 3:
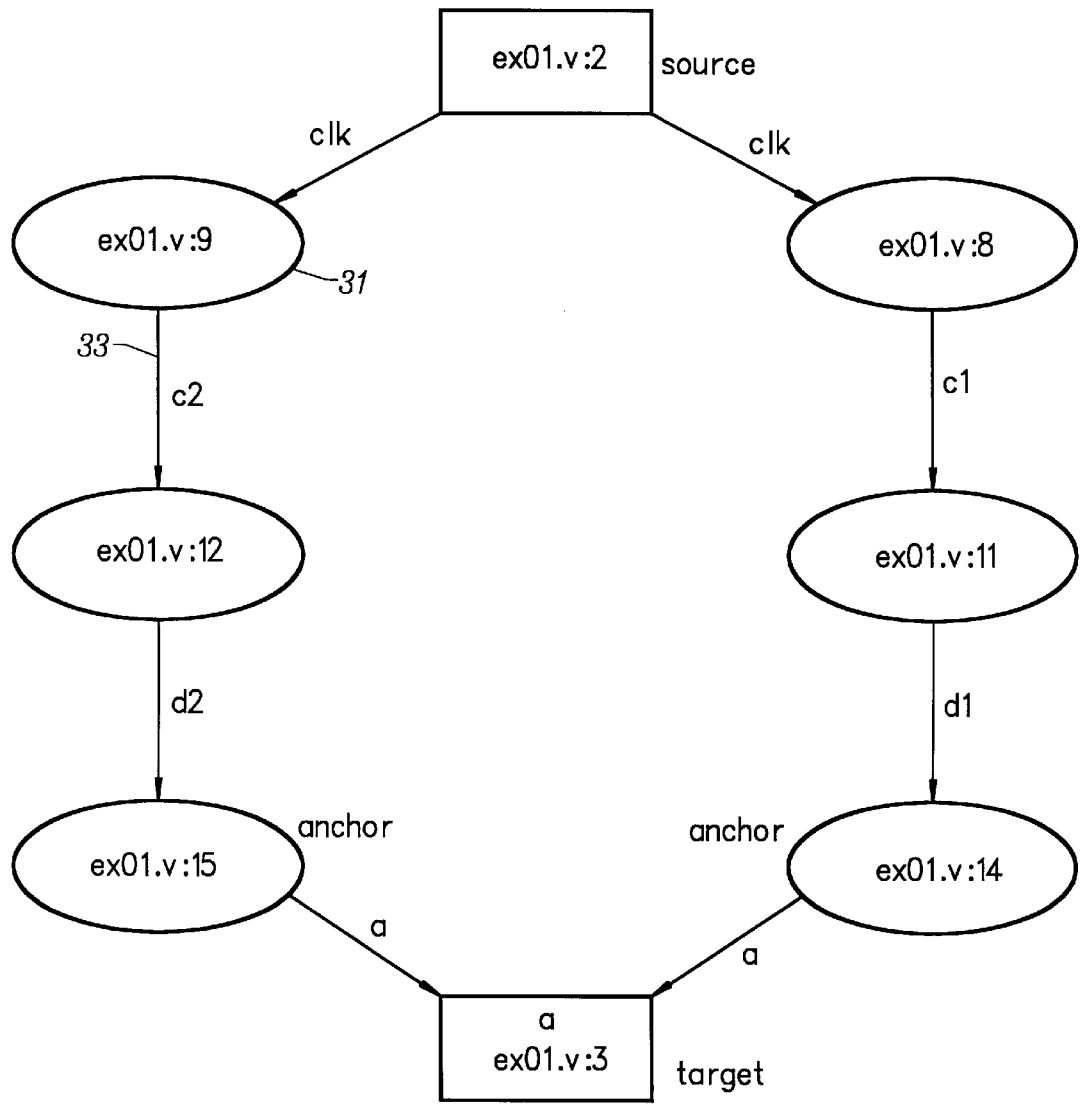
FIG. 3 is a another example of a race graph according to the invention.

Another example is shown with a Verilog design in Table 2 below, and its race graph in FIG. 3. In a race-detection software tool, mouse-clicking on the node with label "ex01.v:9" (FIG. 3; 31) highlights Line 9 of the Verilog code, and mouse-clicking on the link with label "c2" (FIG. 3; 33) highlight the "c2" of Line 9 in the Verilog code.

TABLE 2

| Verilog Design | |
|---|---|
| module foo(clk, a, b); | // 1 |
| input clk; | // 2 |
| output a; | // 3 |
| input b; | // 4 |
| wire d1, d2; | // 5 |
| reg c1, c2, a; | // 6 |
|  | // 7 |
| always @(posedge clk) c1 = b; | // 8 |
| always @(posedge clk) c2 = ~b; | // 9 |
|  | // 10 |
| assign d1 = c1; | // 11 |
| assign d2 = c2; | // 12 |
|  | // 13 |
| always @(d1) a = d1; | // 14 |
| always @(d2) a = d2; | // 15 |
| endmodule | // 16 |

In this example, symbol as written at line 14 and line 15, which are triggered by line 11 and 12 respectively, which in turn are triggered by line 8 and 9 respectively, and which are both sensitive to the value change of clk. That is, once clk is changed, both line 14 and 15 may be executed. However, it is not guaranteed whether line 14 or line 15 is executed earlier. This is called a race.

To detect a race, the circuit is first translated into a directed graph, referred to as a design graph herein. In this graph, there are two kind of nodes, i.e. computing nodes and data nodes.

Computing nodes are computing elements, such as an always block in Verilog designs.

Data nodes are storage or wiring elements, such as a reg in Verilog designs.

Edges are used to link computing nodes and data nodes to denote signal flows and triggering relations.

A Verilog always block provides an example. Suppose there is an always block such as the following:

always @ (a) b=a;

In this example, the invention generates:

One computing node B1 for the always block;

One data node B2 for symbol "a";

One data node B3 for symbol "a";

One edge from B2 to B1, because when "a" is changed, B1 must be executed; and

One edge from B1 to B3 because after B1 is executed, the value of "b" may change.

Figure 4:
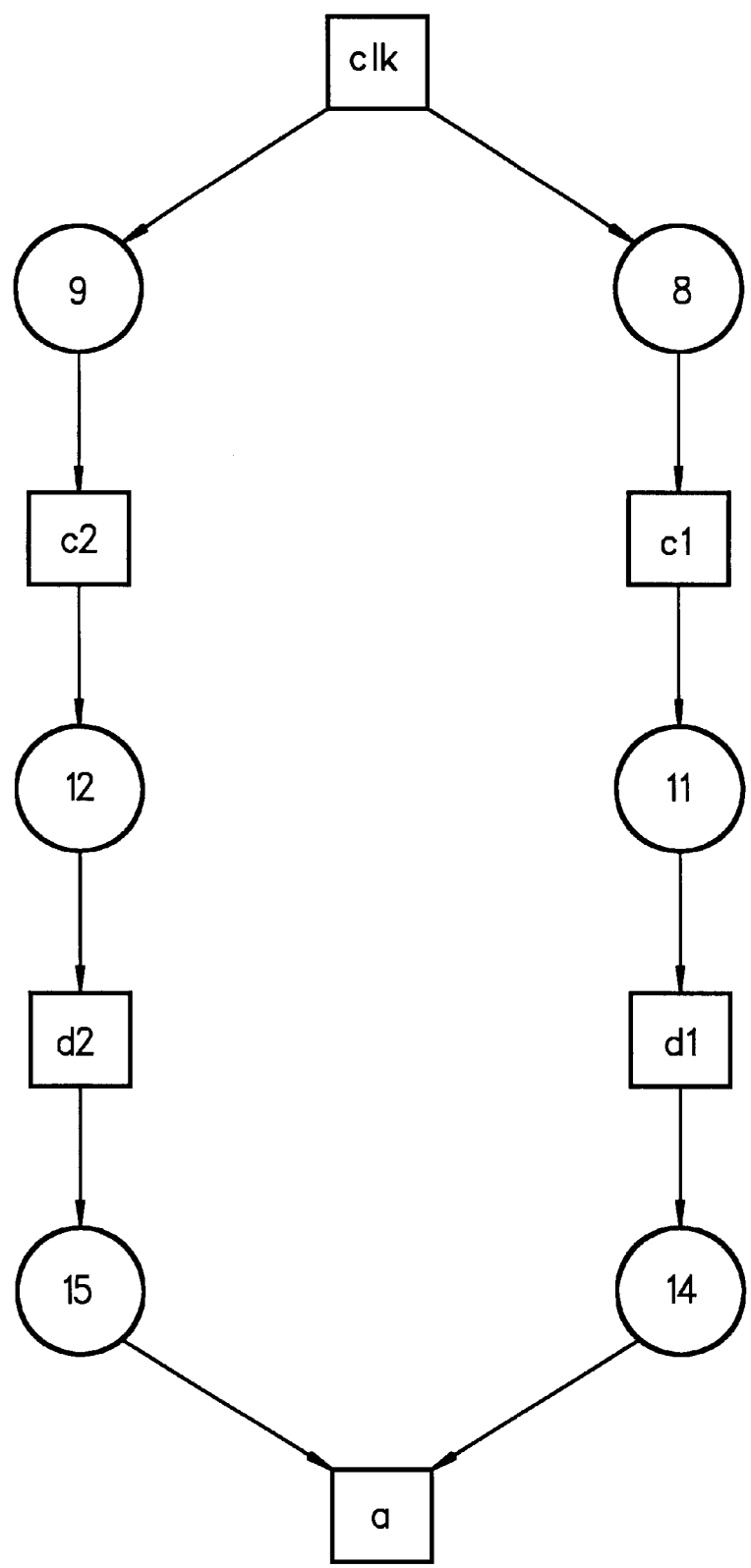
FIG. 4 is a design graph for the Verilog design module foo (in Table 2) according to the invention.

The Verilog design module foo above is represented by the design graph of FIG. 4.

Write-write Race Detection Algorithm

To detect write-write races in accordance with the presently preferred embodiment of the invention, the following algorithm is applied:

Target Selection Step

First, choose a possible target node. In this example, suppose "a" (FIG. 4) is chosen as the target node.

Anchor Pair Selection Step

Next, choose a pair of possible anchor nodes. In this example, there are only two possible anchor nodes, i.e. node "15" and node "14". Nodes "14" and "15" are hence the only possible pair.

Backward Traversal Step

Next, starting from each of the anchor nodes, the design graph is traversed in backward direction:

Backward Traversal for Path 1

Traverse backward from Node "15" (one of the anchor nodes), and mark all the traversed nodes with "m1", The marked nodes are "15", "d2", "12"; "c2 ", "9", and "clk".

Backward Traversal for Path 2

Also, traverse backward from Node "14" (another anchor node). The traversal stops traversing down an edge whenever it visits a node which has, been marked with "m1". Also, all the nodes that are traversed this time are marked with "m2". The marked nodes are "14", "d1", "11""c1", "8", and "clk".

Source Collection Step

All the nodes that are marked with both "m1" and "m2" are the source nodes. In this example, the only source node is Node "clk".

Forward Traversal Step

Next, starting from a source node, the design graph is traversed in forward direction:

Forward Traversal for Path 1

Traverse forward toward Node "15", over the nodes previously marked with "m1". The nodes and edges traversed constitute the first path of the race graph.

Path Condition Collection and Verification for Path 1

Also, during the traversal the path condition is collected and verified aggregately. Whenever it is found that the path condition becomes always false, the traversal aborts and the process continues with the next possible source node.

Forward Traversal for Path 2

Traverse forward toward Node "14", over the nodes previously marked with "m2".

The nodes and edges traversed constitute the second path of the race graph.

Path Condition Collection and Verification for Path 2

Also, the path condition is collected and verified similarly as that for Path 1.

Dual Path Condition Check Step

The path conditions of the first and the second paths are combined together to check if they could be always false. If the conditions are found to be always false, there is no race for this source and pair of anchor nodes.

Race Graph Generation Step

If the race is not ruled out by the condition checks, then the result is a race graph. The first and the second paths, together with the target node, constitute the race graph. Some work can be done to improve the presentation of the race graph. For example, if a data node is between two computing nodes, one can eliminate the data node, link these two computing nodes directly, and put the data node label as the new edge's label. By doing this, one gets the race graph (in FIG. 3).

Single Path Condition Check

A path condition is the aggregate conditions over a path of the design graph, such that when it is satisfied, executing the starting node of the path results in the execution of the ending node of the path. For example, consider the design of Table 3 below.

TABLE 3

Example Design

```
always @(a or b)    // B1
  if (a == 1'b0)
    c = b;
always @(a or c)    // B2
  if (a == 1'b1)
    d = c;
```

Conceptually, there might be a path from the first always block, (computing node B1), to signal "c", (data node "c"), then to the second always block (computing node B2), and finally to signal "d" (data node "d"). Note that to have "c=b" executed, "a==1'b0" must hold; and to have "d=c" executed, "a==1'b1" must hold. However, the path condition ((a== 1'b0) AND (a==1'b1)) is always false. Therefore, there should be no such a path as stated.

During race detection in the forward traversal stage, one can collect and verify the path condition aggregately, and abort the traversal accordingly. Any condition that can be used to rule out a race can be used as the path condition.

Single Path Condition Check Using Branch Conditions

In this example, the conditions used are branch conditions. The term branch condition is used to mean the condition in an "if" statement or a "case" statement in most programming languages and hardware description languages. In these statements, the execution branches to one part of the program or another part of the program. This is why the conditions in these statements are called branch conditions.

Dual Path Condition Check

The path conditions of the first and the second paths can also be combined together to check if the race is possible. Suppose traversing path 1 needs path condition 1 to hold, and traversing path 2 needs path condition 2 to hold. If condition 1 and condition 2 contradict each other, then the race is not possible.

Dual Path Condition Check Using Branch Conditions

When branch conditions are used as path conditions; the path conditions of the first and the second paths can also be AND'ed together to check if the race is possible. For example, suppose the first path's condition is "c==d", and the second path's condition is "c !=d". When these two conditions AND'ed together, the result is ((c==d) AND (c !=d)), which is FALSE. Therefore, there is no race in this situation.

Dual Path Condition Check Using Non-blocking Assignments

There are various kinds of path conditions. They could be used to rule out false races that would otherwise be reported. For example, in Verilog design there are so called non-blocking assignments and blocking assignments, which affect the simulation steps. Suppose during the forward traversal, it is found that the first path and the second path have different steps of non-blocking assignments. Then the race can be ruled out. This is another kind of path condition.

Consider as an example the Verilog code as Table 4 below.

TABLE 4

Verilog Code

```
module t(clk, a, b, c);
  input clk, b; c;
  output a;
  reg a, d, e;
  always @(posedge clk) e <= b; //C1
  always @(e) a <= e; // C2
  always @(posedge clk) d <= c; // C3
  always @(d) a = d; // C4
endmodule // t
```

There is an otherwise write-write race to signal "a", starting from "clk". Path 1 takes the route. "clk=>C1=>e= >C2=>a", and Path 2 takes the route "clk=>C3=>d=>C4= >a". However, to get "a" assigned along Path 1, it takes two steps or simulation cycles because there are two non-blocking assignments denoted by "=>" in the path. On the other hand, to get "a" assigned along Path 2 it only takes one step. As a result, assignments to "a" along Path 1 and 2 cannot happen at the same simulation cycle, and hence there is no race.

Figure 5:
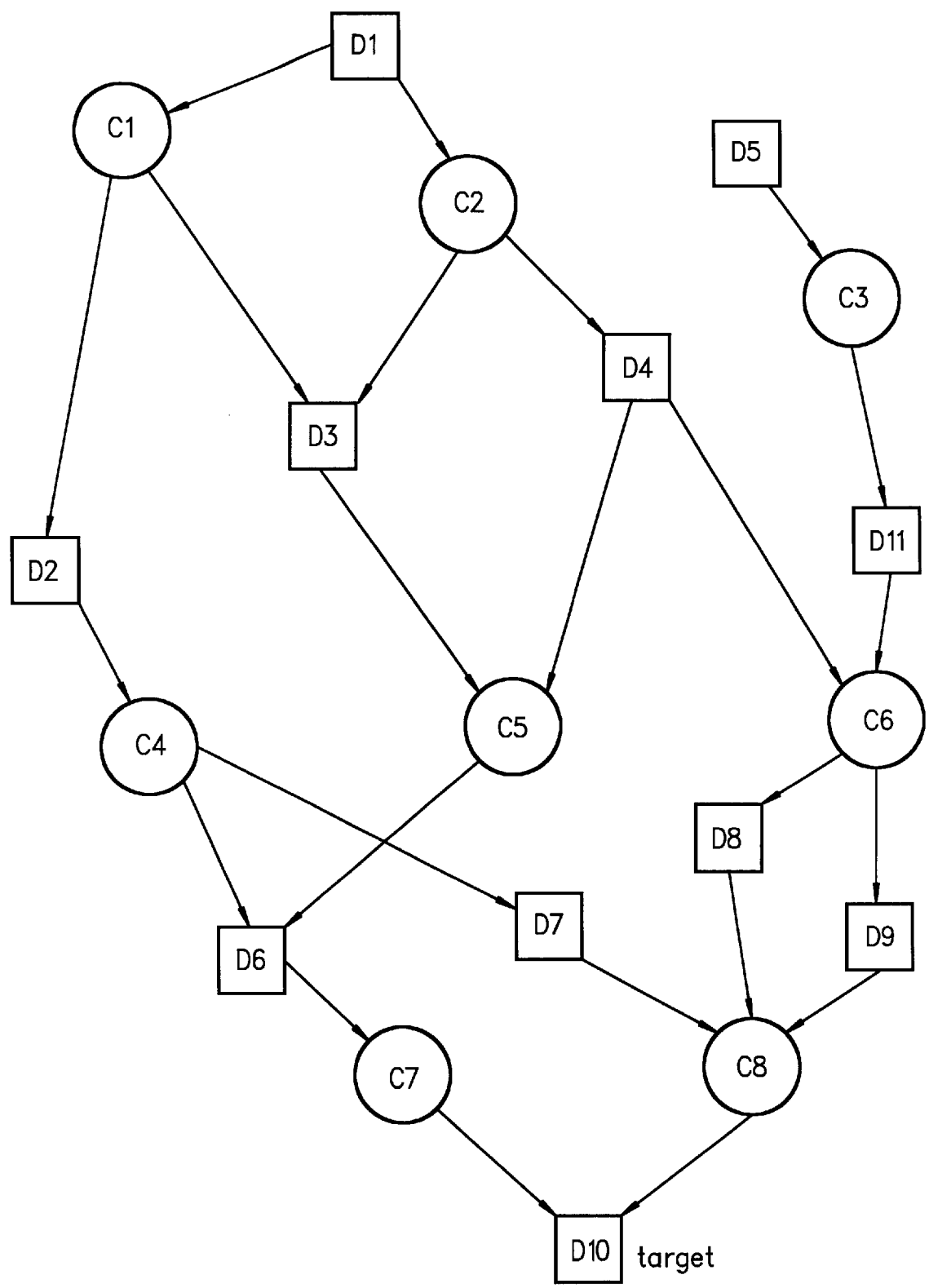
FIG. 5 is an example of a more complicated design graph according to the invention.

The following is a more complicated traversal example. Suppose there is a design graph as shown in FIG. 5. For the following discussion, refer to the steps of detecting write-write races above.

In the Target Section Step, a data node is chosen. Suppose D10 is selected here.

Next, in the Anchor Pair Selection Step, all possible anchors (for D10) are identified and each pair of anchors are selected in turn. In this case, there are only two predecessors of D10, so the only pair of D10's anchor nodes is C7 and C8.

Figure 6:
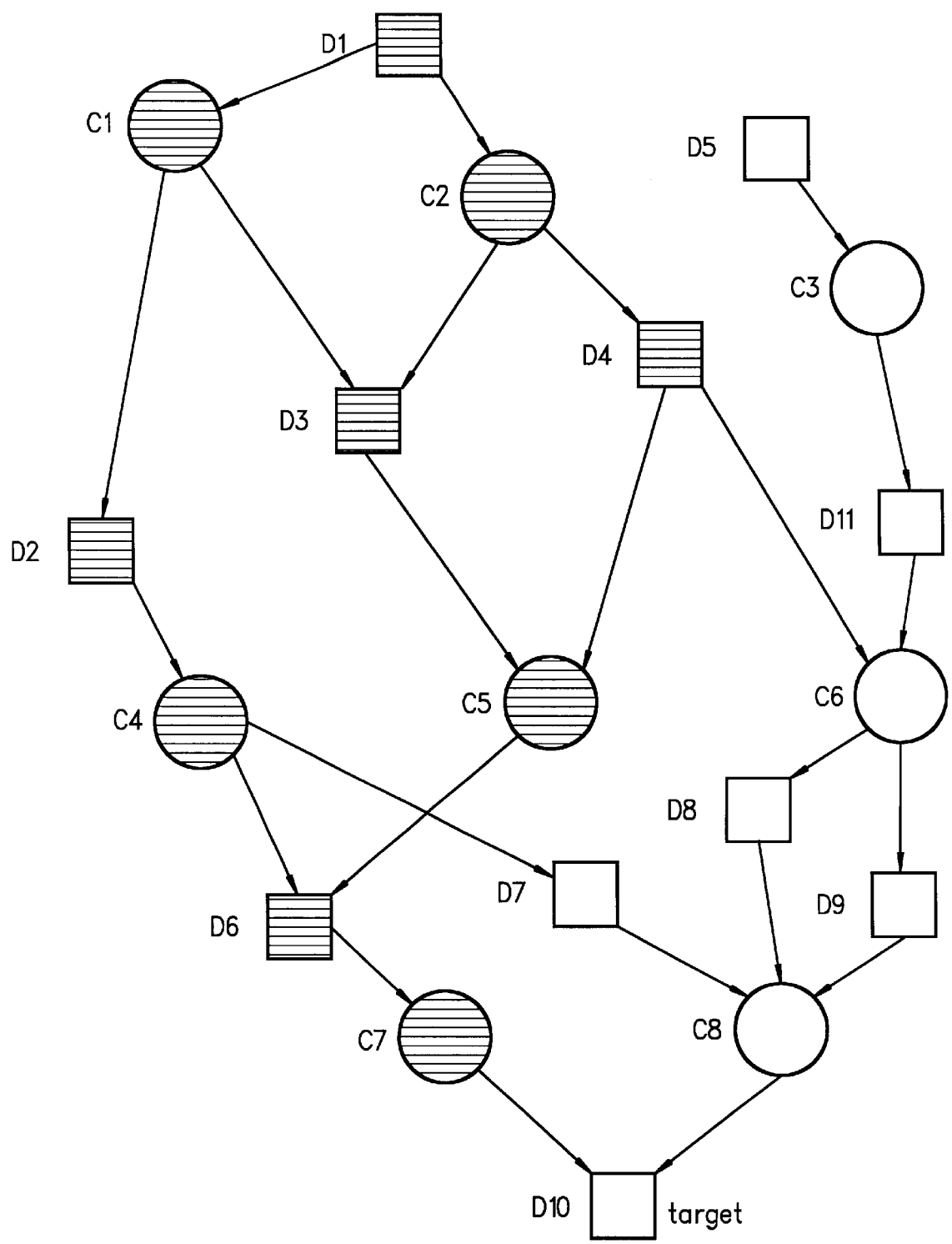
FIG. 6 is an example of the more complicated design graph of FIG. 5 in which traversed nodes are marked with horizontal lines according to the invention.

In the Backward Traversal Step, the process traverses backward from each of the anchor nodes to find the common source node. First, the process traverses backward from C7 (Backward Traversal for Path 1). The traversed nodes are marked with horizontal lines as shown in FIG. 6.

Figure 7:
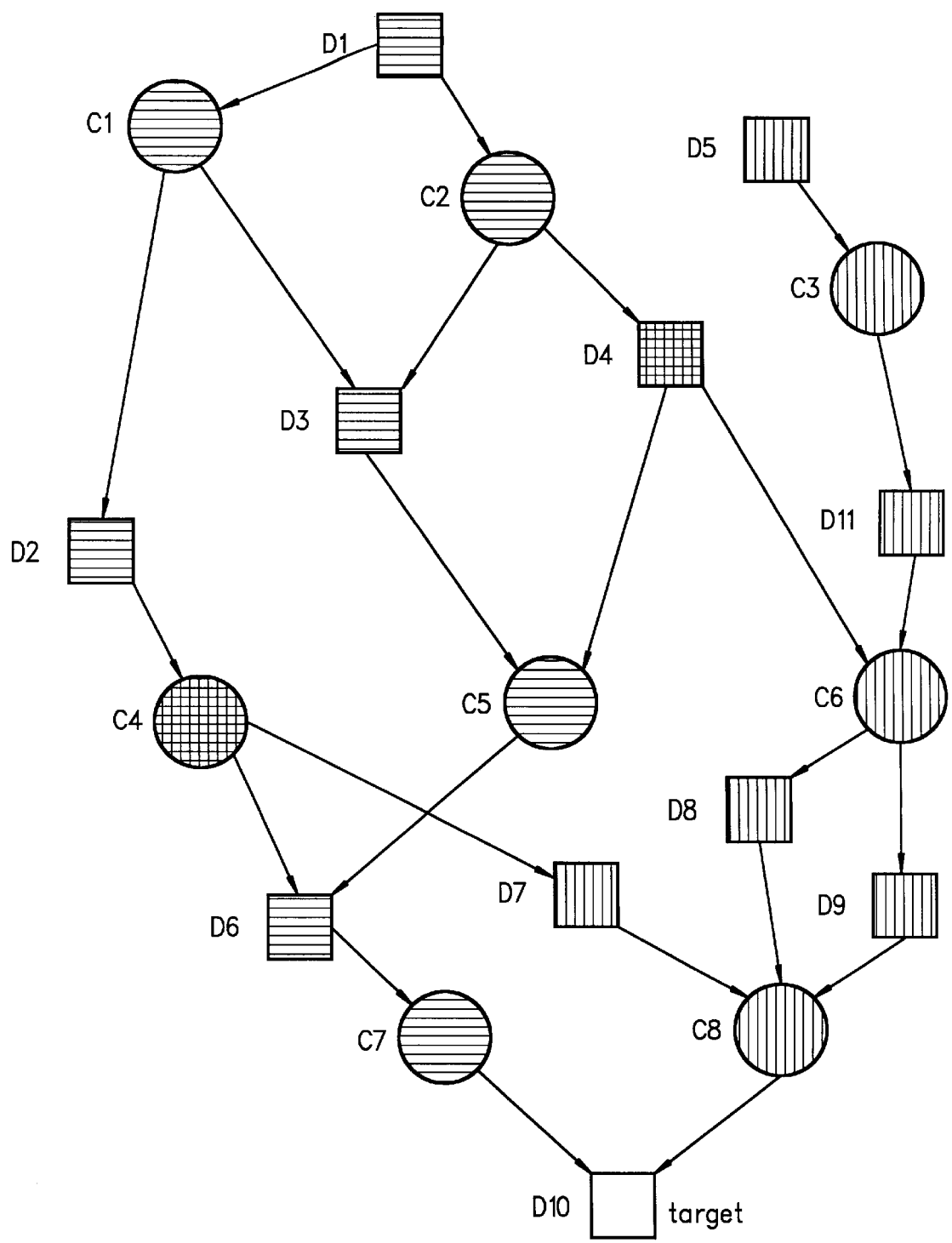
FIG. 7 is an example of the more complicated design graph of FIG. 5 in which traversed nodes are marked with vertical lines according to the invention.

Next, the process traverses backward from C8 (Backward Traversal for Path 2). The traversed nodes are marked with vertical lines as shown FIG. 7. Note that the nodes which are marked by both horizontal lines and vertical lines are the source nodes (Source Collection Step). In this case, C4 and D4 are the source nodes.

Figure 8:
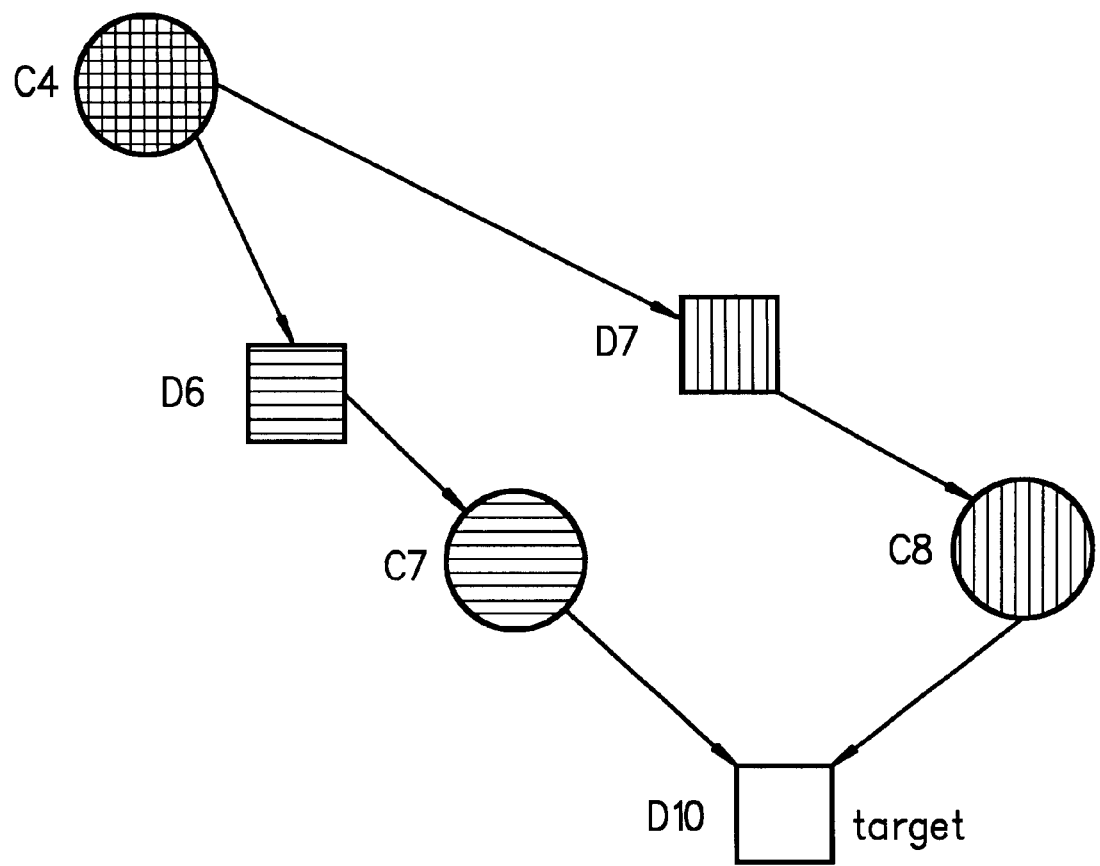
FIG. 8 is an example of the more complicated design graph of FIG. 5 in which traversed nodes constitute a race graph according to the invention.

Next, the process starts from the source node C4 and traverses forward, performing the Forward Traversal Step, including its sub-steps. The traversed nodes constitute a race graph, as shown in FIG. 8.

Figure 9:
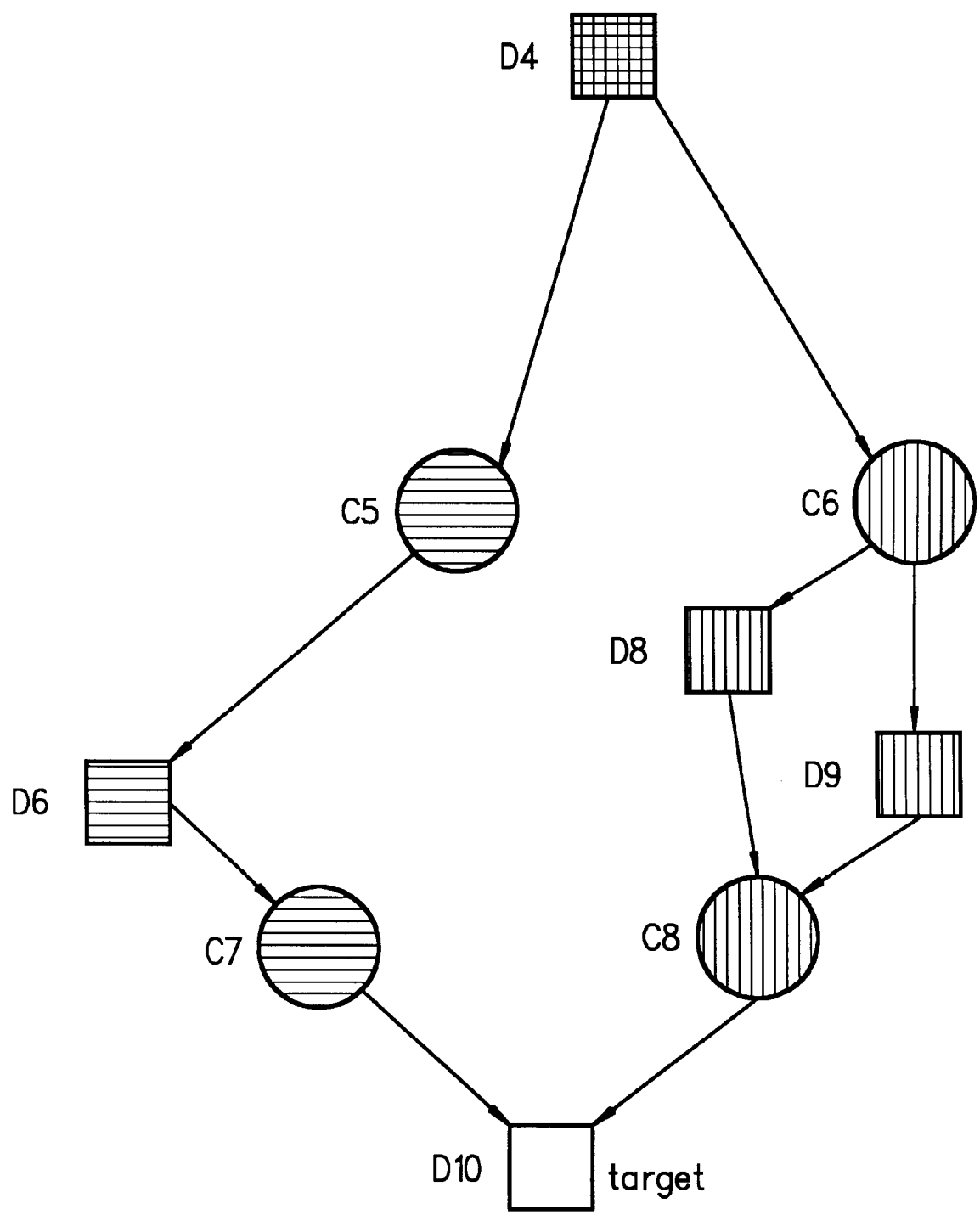
FIG. 9 is an example of the more complicated design graph of FIG. 5 in which traversed nodes constitute another race graph according to the invention.

The process then starts from another source node D4 and traverses forward, performing the Forward Traversal Step, including its sub-steps. The traversed nodes constitute another race graph, as shown in FIG. 9.

General Race Detection Algorithm

The general race detection algorithm is described as shown in Table 5 below.

TABLE 5

General Race Detection Algorithm

```
do Target Selection;
for each target t, do:
    do Anchor Pair Selection;
    for each anchor pair (a1, a2),
        do Backward Traversal (BT):
            do BT from a1;
            do BT from a2;
        do Source Collection;
        for each source s,
            do Forward Traversal (FT):
                do FT and Single Path Condition Check for path
```

TABLE 5-continued

General Race Detection Algorithm

1;
    do FT and Single Path Condition Check for path
2;
    do Dual Path Condition Check;
    do Race Graph Generation;

The traversals in the Backward Traversal and the Forward Traversal steps are basically graph traversals. That is, depth-first order traversal or breadth-first order traversal can be used to traverse the graph to avoid a node or an edge being traversed multiple times (see, for example, T. Cormen et al, *Introduction to Algorithms*, McGraw-Hill Book Company, New York, (1993) ISBN: 0-07-013143-0).

Use Predecessor Matrix to Improve Backward Traversal Efficiency

To improve the efficiency of the Backward Traversal Step, a predecessor matrix can be used. Suppose there are n nodes in the design graph. A predecessor matrix M is an n by n matrix, where element M (i,j) is 1 is Node j is a direct or indirect predecessor of Node i, and M (i, j) is 0 otherwise.

The predecessor matrix M can be computed as follows:

For each node, if Node j is a direct predecessor of Node i, set M(i, j) to 1. Otherwise, set it to 0.

Perform a transitive closure algorithm on the matrix M (see, for example, T. Cormen et al, *Introduction to Algorithms*, McGraw-Hill Book Company, New York, (1993) ISBN: 0-07-013143-0)

Before the Backward Traversal Step, the predecessor matrix can be computed. After it is computed, row i of M determines the set of all nodes that are predecessors of node i. With Node a and Node b as the anchor pair, one can improve the backward traversal as follows:

Compute the set of common sources of Node a and Node b, by performing a logical AND operation of the Row a and Row b. Let the resulting vector be called S.

Suppose during the backward traversal, Node c is now being traversed. If the process can traverse backward from Node c to any one of the common source nodes, then the logical AND of row c of the matrix M, which is the predecessors of Node c, and the vector S should not be a vector of all zeros.

Using this property, one can avoid traversing further into nodes which do not lead to common source nodes.

Read-write Race Detection Algorithm

To detect read-write races, it is only necessary to change the Anchor Pair Selection Step. All other steps are the same as the steps of detecting write-write races. When detecting read-write races, after a target node "D" is selected, the process does the following for the Anchor Pair Selection Step:

Put in Set 1 all the computing nodes which read the target node. For example; for the following Verilog always block:
always @ (b or c) a=b+c;
If "b" is the target node, then this always block, i.e. a computing node, should be put in Set 1.

Put in Set 2 all the computing nodes which write to the target node. For example, for the following Verilog always block:
always @ (d or e) b=d+e;
If "b" is the target node, then this always block, i.e. a computing node, should be put in Set 2.

Select one node from Set 1 and another node from Set 2. These two-nodes are the anchor pair selected.

Trigger Races

The above race detection algorithm can also be used to detect a new, third kind of races, called trigger races. Previously, the art defined a race as a situation where a read/write action may happen before or after another read/write action nondeterministically. In this definition, the target being raced for comprises passive objects, i.e. data nodes, such as circuit registers or HDL program variables.

In trigger races the target is a computing node instead of a data node, such as a circuit element, where the target node can be triggered by the value changes of two or more signals. As a result, the target node could be triggered once or twice, depending on the arrival order of the events, i.e. value changes of signals. This situation in turn could affect the signal values driven by the target, i.e. computing, node.

The following is an example of trigger races. In the Verilog circuit design of Table 6 below, the target node can be triggered by the value changes of "a" or "b". Depending on the value change events order of arrival, the register "c" could be increased once or twice, or even set to other values. For example, suppose a, ai, b, and bi are not equal. There are two possible simulation sequences:

B1 is executed, B2 is executed, and then the target node is executed. In this case, "c" is increased by 1.

B1 is executed, the target node is executed, then B2 is executed, and finally the target node is executed again. In this case, "c" is increased by 2.

As a result, the final value of "c" is nondeterministic. This is a trigger race.

TABLE 6

Trigger Race

```
module t(clk, ai, bi);
    input clk;
    input ai;
    input bi;
    reg   a, b, c;
    always @(posedge clk) b = bi; // B1
    always @(posedge clk) a = ai; // B2
    always @(a or b) // target node
        begin
            if (a != b)
                c = c + 1;
            else
                c = 0;
        end
endmodule
```

Trigger Race Detection Algorithm

To detect trigger races, the invention uses the general race detection algorithm described above, but performs a different Target Selection Step and Anchor Pair Selection Step.

To detect trigger races, a target selected in the Target Selection Step should satisfy the following conditions:

It is a computing node;

It has two or more trigger nodes; and

It assigns a value to a register or a latch.

A register or a latch is a value storage device of a circuit. In contrast, a wire in a circuit is not a storage device.

To detect trigger races, the Anchor Pairs are selected as follows:

For a (computing) target node T, find, the set D which contains all the data nodes that trigger the target node T.

For two distinct data nodes D1 and D2 in D,
find the set S1 which contains all the computing nodes that write to D1;

find the set S2 which contains all the computing nodes that write to D2;
select a node from S1 and a node from S2. These two nodes can be an anchor pair.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

What is claimed is:

1. A race detection method, comprising the steps of:
selecting one or more targets;
for each said target, selecting one or more anchor pairs;
for each said anchor pair, performing a backward traversal;
for each said anchor pair, performing a source collection; and
for each said source, performing a forward traversal.

2. The method of claim 1, further comprising the step of: performing said backward traversal first for a first anchor node and thereafter for any subsequent anchor nodes.

3. The method of claim 1, said forward traversal further comprising the steps of:
performing a forward traversal and a single path condition check for a first path; and
performing a forward traversal and a single path condition check for any subsequent paths.

4. The method of claim 1, said forward traversal further comprising the step of:
performing a dual path condition check.

5. The method of claim 1, further comprising the step of: generating a race graph.

6. The method of claim 1, wherein traversals in said backward traversal and said forward traversal steps are graph traversals.

7. The method of claim 6, wherein said graph traversals comprise:
a depth-first order traversal and/or a breadth-first order traversal for traversing said graph to avoid a node or an edge being traversed multiple times.

8. The method of claim 1, further comprising a write-write race detection method, wherein said target selection step and said anchor pair selection step are defined for detecting write-write races.

9. A method for detecting, write-write races, comprising the steps of:
choosing a possible target node;
choosing a pair of possible anchor nodes;
starting from each of said anchor nodes, traversing a design graph in a backward direction from a first anchor node;
marking all the traversed nodes for a first path for said first anchor node;
traversing backward from another anchor node, wherein said traversal stops traversing down an edge whenever it visits a node which has been marked;
marking all nodes that are traversed along a second path for said another anchor node;
wherein all nodes that are marked for said first and said another anchor node are source nodes;
starting from a source node, traversing said design graph in a forward direction;
traversing forward a first time toward a target node, over nodes previously marked along said first path, wherein nodes and edges traversed constitute a first path of a race graph;
during said first forward traversal, collecting a path condition and verifying aggregately, wherein whenever a path condition is always false, said forward traversal aborts and said process continues with a next possible source node;
traversing forward a second time toward said target node over nodes previously marked along said second path, wherein nodes and edges traversed constitute a second path of said race graph;
during said second forward traversal, collecting a path condition and verifying aggregately, wherein whenever a path condition is always false, said forward traversal aborts and said process continues with a next possible source node; and
combining path conditions of said first and the second paths together to check if it could be always false and, if so, there is no race for this source and pair of anchor nodes.

10. The method of claim 9, wherein if a race is not ruled out by said condition checks, then said first and the second paths, together with said target node, constitute a race graph.

11. A read-write race detection method, comprising the steps of:
selecting one or more target nodes;
for each said target node, selecting one or more anchor pairs for detecting read-write races by:
putting all computing nodes which read said target node in a first set;
putting all the computing nodes which write to said target node in a second set; and
selecting one node from said first set and another node from said second set 2;
for each said anchor pair, performing a backward traversal;
for each said anchor pair, performing a source collection; and
for each said source, performing a forward traversal.

12. A trigger race detection method, comprising the steps of:
selecting one or more target nodes, wherein a target node is a computing node, has two or more trigger nodes, and assigns a value to a register or a latch; for each said target node, selecting one or more anchor pairs for detecting trigger races by any of:
a) finding a data set which contains all data nodes that trigger said target node for a computing target node; and
b) finding a first set which contains all computing nodes that write to a first distinct data node in the said data set;
finding a second set which contains all computing nodes that write to a second distinct data node in the said data set; and
selecting a node from said first set and a node from said second set as said anchor pair;
for each said anchor pair, performing a backward traversal;
for each said anchor pair, performing a source collection; and
for each said source, performing a forward traversal.

13. A race detection method, comprising the steps of:
selecting one or more targets;
for each said target, selecting one or more anchor pairs;
for each said anchor pair, performing a backward traversal using a predecessor matrix;

for each said anchor pair, performing a source collection; and for each said source, performing a forward traversal.

14. The method of claim 13, wherein said predecessor matrix is computed as follows:

for each node, if a node j is a direct predecessor of a node i, set M(i, j) to 1; otherwise, set M(i, j) to 0;

perform a transitive closure algorithm on said matrix M.

15. The method of claim 14, wherein in said predecessor matrix, row i of M determines a set of all nodes that are predecessors of node i.

16. The method of claim 13 wherein said backward traversal comprising the steps of:

selecting a node a and a node b as said anchor pair;

performing said backward traversal as follows:

computing a set of common sources of said node a and said node b by, performing a logical AND operation of a row a and a row b, resulting in a vector S;

during said backward traversal, where a node c is being traversed, if it is possible to traverse backward from said node c to any one or more common source nodes, then a logical AND of a row c of said matrix M, which is the predecessors of said node c, and said vector S is not a vector of all zeros;

using a resulting property to avoid traversing further into nodes which do not lead to common source nodes.

17. A race detection apparatus, comprising:

one or more targets;

means for selecting one or more of said one or more targets;

one or more anchor pairs;

for each said target, means for selecting one or more of said one or more anchor pairs;

for each said anchor pair, means for performing a backward traversal;

for each said anchor pair, means for performing a source collection; and for each said source, means for performing a forward traversal.

18. The apparatus of claim 17, further comprising:

means for performing said backward traversal first for a first anchor node and thereafter for any subsequent anchor nodes.

19. The apparatus of claim 17, said forward traversal further comprising:

means for performing a forward traversal and a single path condition check for a first path; and means for performing a forward traversal and a single path condition check for any subsequent paths.

20. The apparatus of claim 17, said forward traversal further comprising:

means for performing a dual path condition check.

21. The apparatus of claim 17, further comprising:

a race graph generator.

22. The apparatus of claim 17, wherein traversals in said backward traversal and said forward traversal steps are graph traversals.

23. The apparatus of claim 22, wherein said graph traversals comprise:

a depth-first order traversal and/or a breadth-first order traversal for traversing said graph to avoid a node or an edge-being traversed multiple times.

24. The apparatus of claim 17, further comprising a write-write race detection mechanism, wherein said target selection step and said anchor pair selection step are defined for detecting write-write races.

25. The apparatus of claim 17, used for detecting trigger races wherein said one or more targets comprise a computing node, have two or more trigger nodes, and assign a value to a register or a latch; and for each said target node, said means for selecting one or more anchor pairs comprising the steps of:

a) finding a data set which contains all data nodes that trigger said target node for a computing target node; and b) finding a first set which contains all computing nodes that write to a first distinct data node in the said data set;

finding a second set which contains all computing nodes that write to a second distinct data node in the said data set; and selecting a node from said first set and a node from said second set as said anchor pair.

26. A race detection apparatus, comprising:

one or more target nodes;

means for selecting one or more of said one or more target nodes;

one or more anchor pairs;

for each said target node, means for selecting one or more of said one or more anchor pairs for detecting read-write races by:

putting all computing nodes which read said target node in a first set;

putting all the computing nodes which write to said target node in a second set; and selecting one node from said first set and another node from said second set;

for each said anchor pair, means for performing a backward traversal;

for each said anchor pair, means for performing a source collection; and for each said source, means for performing a forward traversal.

27. A race detection apparatus, comprising:

one or more targets;

selecting one or more of said one or more targets;

one or more anchor pairs;

for each said target, selecting one or more of said one or more anchor pairs;

for each said anchor pair, means for performing a backward traversal using a predecessor matrix;

for each said anchor pair, means for performing a source collection; and for each said source, means for performing a forward traversal.

* * * * *